(12) United States Patent
Joo

(10) Patent No.: US 7,492,625 B2
(45) Date of Patent: Feb. 17, 2009

(54) LOADLESS SRAM

(75) Inventor: Joon-Yong Joo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/461,322

(22) Filed: Jul. 31, 2006

(65) Prior Publication Data
US 2007/0025142 A1    Feb. 1, 2007

(30) Foreign Application Priority Data
Jul. 30, 2005    (KR) .................. 10-2005-0070029

(51) Int. Cl.
*G11C 11/00*    (2006.01)
(52) U.S. Cl. .............. 365/154; 365/189.05; 365/189.24
(58) Field of Classification Search ................. 365/154, 365/156, 189.05, 189.24, 186
See application file for complete search history.

(56) References Cited

U.S. PATENT DOCUMENTS

| | | | |
|---|---|---|---|
| 5,790,452 A * | 8/1998 | Lien ............................ | 365/154 |
| 6,181,608 B1 * | 1/2001 | Keshavarzi et al. ......... | 365/188 |
| 6,466,489 B1 * | 10/2002 | Ieong et al. ............. | 365/189.09 |
| 6,552,923 B2 | 4/2003 | Houston | |
| 6,724,650 B2 * | 4/2004 | Andoh ........................ | 365/156 |
| 6,909,635 B2 * | 6/2005 | Forbes et al. ................. | 365/174 |
| 6,920,061 B2 * | 7/2005 | Bhavnagarwala et al. ... | 365/154 |
| 6,934,182 B2 * | 8/2005 | Chan et al. ................... | 365/154 |

FOREIGN PATENT DOCUMENTS

| | | |
|---|---|---|
| JP | 6-338601 | 12/1994 |
| JP | 2000-124333 | 4/2000 |
| KR | 1994-0000311 | 1/1994 |

OTHER PUBLICATIONS

English language abstract of Japanese Publication No. 6-338601.
English language abstract of Japanese Publication No. 2000-124333.

* cited by examiner

*Primary Examiner*—Connie C Yoha
(74) *Attorney, Agent, or Firm*—Marger Johnson & McCollom, P.C.

(57) ABSTRACT

A loadless static random access memory (SRAM) may have transfer transistors with at least two threshold voltages. In some embodiments, the transfer transistors may have gate structures with different portions that produce electric fields in different directions. In some embodiments the transfer gate structures may extend down the sidewalls of an active region. In other embodiments, the transfer transistors may have gate structures with different portions that have different gate lengths.

14 Claims, 10 Drawing Sheets

LOADLESS SRAM

CROSS-REFERENCE TO RELATED APPLICATIONS

This application claims priority from Korean Patent Application No. 10-2005-70029, filed on Jul. 30, 2005 which is incorporated by reference.

BACKGROUND

Static random access memory (SRAM) is used for cache memory because of its low power consumption and high operating speed compared to dynamic random access memory (DRAM). However, SRAM has a lower integration density than DRAM because the area occupied by a unit cell in an SRAM is greater than that in a DRAM. For example, an SRAM unit may normally be composed of six transistors, whereas a DRAM unit cell may only include one access transistor and a capacitor.

FIG. 1 illustrates a prior art SRAM unit cell which is composed of six transistors, PS1, PS2, LD1, LD2, PD1, PD2. Load transistors LD1 and LD2 are connected in series with drive transistors PD1 and PD2 respectively. The drive transistors PD1 and PD2 are arranged in a flip-flop or a latch type of arrangement. The sources of the load transistors LD1 and LD2 are connected to a power source Vcc, and the sources of the drive transistors PD1 and PD2 are connected to a ground voltage source Vs. The sources of the two transfer transistors PS1 and PS2 are connected to bit lines BL1 and BL2, and the gates of the two transfer transistors PS1 and PS2 are connected to a word line WL. The load transistors LD1 and LD2 may be replaced by load resistances.

A four-transistor loadless SRAM, in which load transistors LD1 and LD2 or equivalent load resistances are removed from the six-transistor SRAM structure, has been disclosed in U.S. Pat. No. 6,552,923, titled "SRAM WITH WRITE-BACK ON READ." However, the loadless SRAM described therein uses a CMOS structure. More specifically, the transfer transistors are PMOSFET transistors, and the drive transistors are NMOSFET transistors. Thus, the loadless CMOS SRAM needs an isolation layer for isolating transfer transistors and drive transistors, and as a result, its integration density is limited. Furthermore, this loadless CMOS SRAM has a latch-up problem due to a well diode structure, and hence, it may need additional circuits to prevent the latch-up problem.

A loadless SRAM may maintain the voltage state of a storage node using the off-current of transfer transistors. However, since drive transistors also have an off-current, the node voltage may be unstable. Therefore, in order to increase the stand-by stability in a loadless SRAM, the off-current of the transfer transistors must be higher than the off-current of the drive transistors. However, since excessive off-current of the transistors may negatively influence device speed, switching characteristics and the like, it is necessary to control the off-current appropriately.

SUMMARY

Some of the inventive principles of this patent disclosure relate to a loadless static random access memory (SRAM) having transfer transistors with at least two threshold voltages. In one embodiment, a loadless SRAM includes a word line, a pair of first and second bit lines, and four transistors. The first transistor has at least two threshold voltages and is coupled between the first bit line and a first node and controlled by the word line voltage. The second transistor has at least two threshold voltages and is coupled between the second bit line and a second node and controlled by the word line voltage. The third transistor is coupled between a third node and the first node and controlled by the second node voltage. The forth transistor is coupled between the third node and the second node and controlled by the first node voltage.

Some additional inventive principles of this patent disclosure relate to a loadless SRAM having structures for imparting multiple threshold levels to a transfer transistor. In some embodiments, a transfer transistor may have a gate structure having a first portion with a first threshold voltage and a second portion with a second threshold voltage. In some of these embodiments, the first portion may be structured to form an electric field mostly in a first direction and the second portion may be structured to form an electric field at least partly substantially perpendicular to the first direction. In other embodiments, the first portion may have a first gate length and the second portion may have a second gate length.

Some additional inventive principles of this patent disclosure relate to a loadless SRAM having transfer gate structures with geometries that are substantially different than the geometries of drive gate structures. In one embodiment, a loadless SRAM may include a semiconductor substrate comprising first and second active regions confined by an isolation layer, each of the first and second active regions comprising a first portion having an upper end of at least a first side wall being exposed from the isolation layer, and a second portion, side walls of which are not exposed from the isolation layer; a first transfer gate electrode crossing the first portion of the first active region so as to extend to the isolation layer, and being insulated from the first active region; a second transfer gate electrode crossing the first portion of the second active region so as to extend to the isolation layer, and being insulated from the first active region; a first drive gate electrode crossing the second portion of the first active region so as to extend to the isolation layer, and being insulated from the first active region; and a second drive gate electrode crossing the second portion of the second active region so as to extend to the isolation layer, and being insulated from the second active region.

Some additional inventive principles of this patent disclosure relate to methods of fabricating a loadless SRAM in which an upper end of at least one side wall of an active region is exposed from an isolation layer. One embodiment includes forming an isolation layer in a semiconductor substrate to confine first and second active regions, each having a first portion and a second portion; exposing an upper end of at least one side wall of the first portion of the first and second active regions from the isolation layer; forming a gate insulating layer on the first and second active regions; forming a gate electrode layer on the gate insulating layer; and patterning the gate electrode layer, thereby forming first and second transfer gate electrodes crossing the first portions of the first and second active regions so as to extend to the isolation layer, and being insulated from the first and second active regions respectively, and forming first and second drive gate electrodes crossing the second portions of the first and second active regions so as to extend to the isolation layer, and being insulated from the first and second active regions respectively.

Some additional inventive principles of this patent disclosure relate to methods of fabricating a loadless SRAM in which a transfer gate electrode has a first portion having a first gate length and a second portion having a second gate length. In one embodiment, fabricating a loadless SRAM includes forming an isolation layer in a semiconductor substrate to confine first and second active regions, each having a first portion and a second portion; forming a gate insulating layer on the first and second active regions; forming a gate electrode layer on the gate insulating layer; and patterning the gate electrode layer, thereby forming first and second transfer gate electrodes crossing the first portions of the first and second active regions, and forming first and second drive gate electrodes crossing the second portions of the first and second active regions; wherein each of the first and second transfer gate electrodes comprises a first portion having a first gate length and a second portion having a second gate length. The patterning may comprise implanting impurity ions in the regions of the second portions of the transfer gate electrodes; and etching the gate electrode layer using an etching process in which the regions where the impurity ions are implanted is etched more quickly than regions where impurity ions are not implanted. The patterning may also comprise recrystallizing a resultant patterned structure by oxidation. Alternatively, the patterning may include using a pattern mask in which the pattern for each of the first and second transfer gate electrodes comprises a first portion having a first gate length and a second portion having a second gate length.

DETAILED DESCRIPTION

Figure 1:
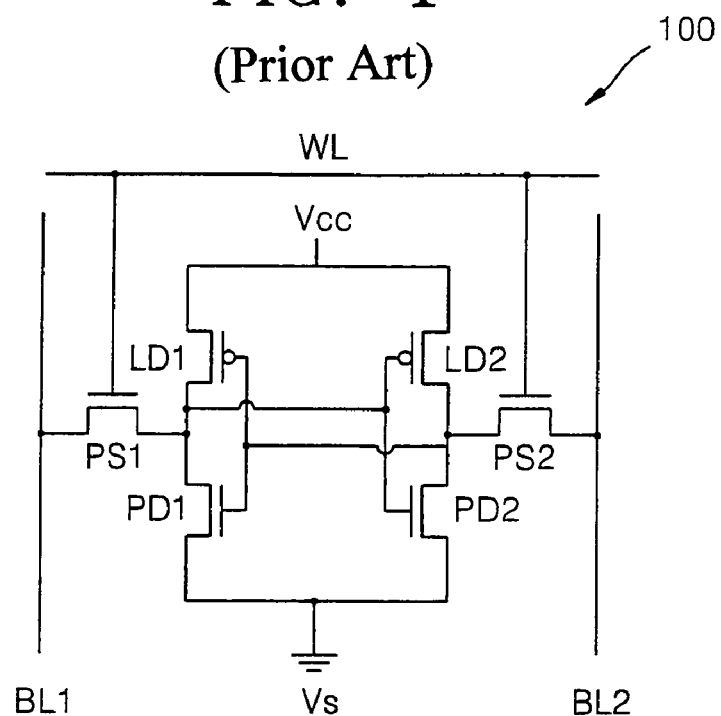
FIG. 1 is a prior art circuit diagram illustrating a conventional CMOS static random access memory (SRAM) having a 6-transistor structure.

The inventive principles of this patent disclosure will now be described more fully hereinafter with reference to the accompanying drawings, in which preferred embodiments of the invention are shown. These inventive principles, however, be embodied in many different forms and should not be construed as being limited to the embodiments set forth herein. Rather, these embodiments are provided so that this disclosure will be thorough and complete, and will fully convey the scope of the inventive principles to those skilled in the art. In the drawings, the thicknesses of layers and regions may be exaggerated for clarity.

Circuit and Structure

Figure 2:
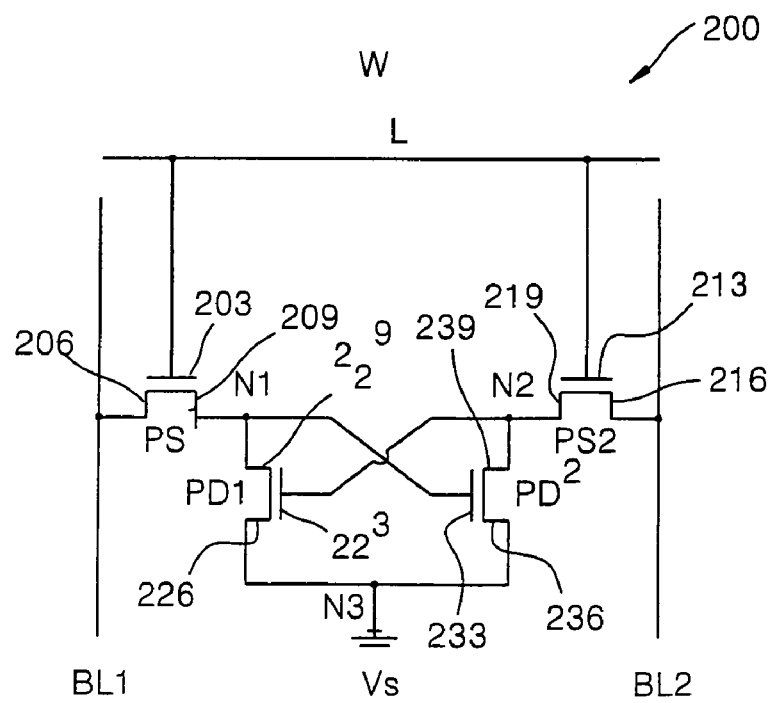
FIG. 2 is a circuit diagram illustrating an embodiment of a loadless SRAM according to some inventive principles of this patent disclosure.

FIG. 2 is a circuit diagram illustrating an embodiment of a loadless static random access memory (SRAM) 200 according to some inventive principles of this patent disclosure. The SRAM 200 includes a word line WL, a pair of bit lines BL1 and BL2, a pair of transfer transistors PS1 and PS2, and a pair of drive transistors PD1 and PD2. The SRAM 200 may be a unit cell, and an SRAM embodiment according to some inventive principles of this patent disclosure may include a plurality of SRAMs 200 aligned in an array. For convenience, the SRAM 200 will be explained in the context of a unit cell, but inventive principles are not limited to individual cells.

The transfer transistors PS1 and PS2 and the drive transistors PD1 and PD2 may be the same type of MOSFET transistors, e.g., either NMOSFET or PMOSFET transistors. For example, all four transistors PS1, PS2, PD1 and PD2 may be NMOSFET transistors. Thus, sources 206, 216, 226, 236 and drains 209, 219, 229, 239 may be all formed with the same conductivity type of impurities. As a result, a well region may be formed with one conductivity type of impurities, and hence, the possibility of latch-up in the drive transistors PD1 and PD2 and the transfer transistors PS1, PS2 may be reduced.

However, according to some inventive principles of this patent disclosure the transfer transistors PS1 and PS2 and the drive transistors PD1 and PD2 may be formed using different types of MOSFETs. For example, the transfer transistors PS1 and PS2 may be formed as a PMOSFET, and the drive transistors PD1 and PD2 may be formed as an NMOSFET.

The SRAM 200 does not include a load resistance or a load transistor. Thus, the area of the SRAM 200 may be significantly less compared to the CMOS SRAM 100 of FIG. 1 resulting in an increased integration density. Furthermore, if the transistors PS1, PS2, PD1 and PD2 of the SRAM 200 are all formed of same type MOSFETs, the area of an isolation layer for separating the different conductivity type of MOSFETs may be reduced, and the integration density of the SRAM 200 may be further increased compared to the conventional CMOS SRAM 100.

As an example, the CMOS SRAM 100 may have an area of approximately 85 through 90F2, for instance, 9F×10F or 7F×12F based on the gate length. However, in some embodiments, the SRAM 200 may have an integration density about 40% higher than that of the conventional CMOS SRAM 100.

A voltage may be applied to word line WL and bit lines BL1 and BL2. The first transfer transistor PS1 includes a first gate 203, a first source 206, and a first drain 209. The first gate 203 may be connected to the word line WL, the first source 206 may be connected to the first bit line BL1, and the first drain 209 may be connected to a first node N1. Similarly, the second transfer transistor PS2 includes a second gate 213, a second source 216, and a second drain 219. The second gate 213 may be connected to the word line WL, the second source 216 may be connected to the second bit line BL2, and the second drain 219 may be connected to the second node N2.

The first drive transistor PD1 includes a third gate 223, a third source 226, and a third drain 229. The third gate 223 may be connected to the second node N2, the third source 226 may be connected to a third node N3, and the third drain 229 may be connected to the first node N1. Similarly, the second drive transistor PD2 includes a fourth gate 233, a fourth source 236, and a fourth drain 239. The fourth gate 233 may be connected to the first node N1, the fourth source 236 may be connected to the third node N3, and the fourth drain 239 may be connected to the second node N2. The third node N3 may be connected to a ground voltage source Vs.

The first and second drive transistors PD1 and PD2 are connected to form a flip-flop or latch structure. Specifically, the third drain 229 controls the fourth gate 233 through the first node N1, and the fourth drain 239 controls the third gate 223 through the second node N2. When the first and second drive transistors PD1 and PD2 are NMOSFETs, if the first node N1 is in a high state, the second drive transistor PD2 is turned on, and as a result, the second node N2 is connected to the ground voltage source Vs and therefore is in a low state. The low state of the second node N2 turns off the first drive transistor PD1, and thus, the first node N1 is maintained in a high state. On the other hand, when the second node N2 is in a high state, the first node N1 is maintained in a low state. That is, the first node N1 and the second N2 are always maintained in opposite states. Thus, if any one of the nodes is driven to a certain state, the other node automatically maintains the opposite state. The same principle applies when the first and second drive transistors PD1, PD2 are PMOSFETs.

Figure 11:
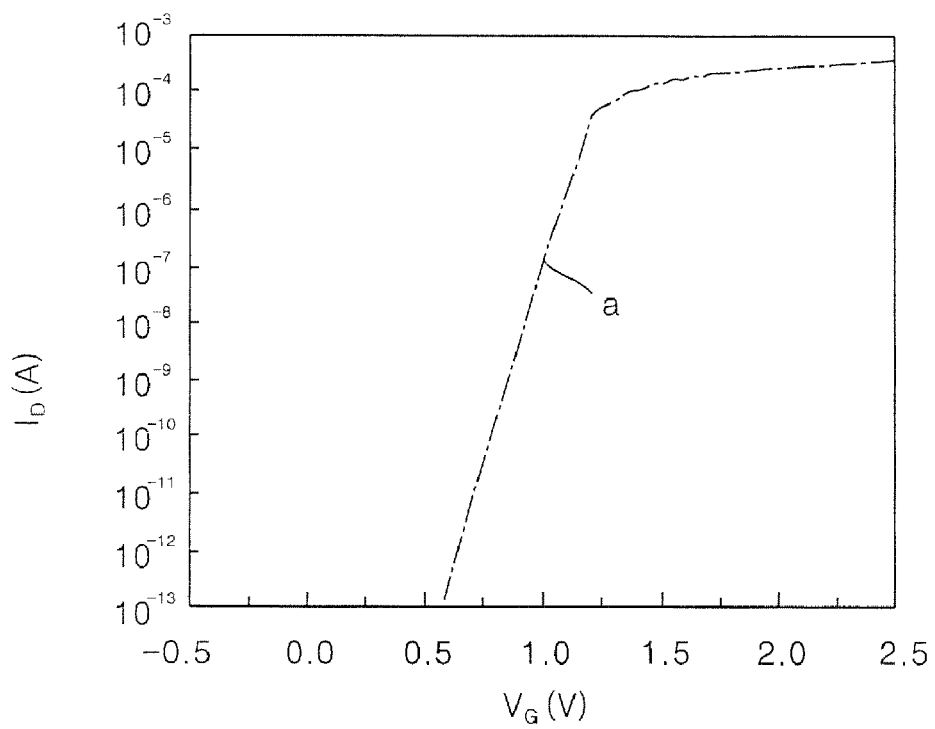
FIG. 11 is a graph illustrating drain current characteristics in accordance with a gate voltage of a drive transistor of the SRAM of FIG. 2.

FIG. 11 illustrates the relationship between the drain current ID and the gate voltage VG of the drive transistors PD1 and PD2. In the curve "a," if the gate voltage VG reaches a threshold voltage or higher, for example, 0.6 V or higher, the drain current ID increases rapidly. That is, the drive transistors PD1 and PD2 are turned on at a threshold voltage or higher. On the other hand, low off-current values are shown at a voltage lower than the threshold voltage. The threshold voltage may be measured using typical methods widely known to those skilled in the art.

Figure 12:
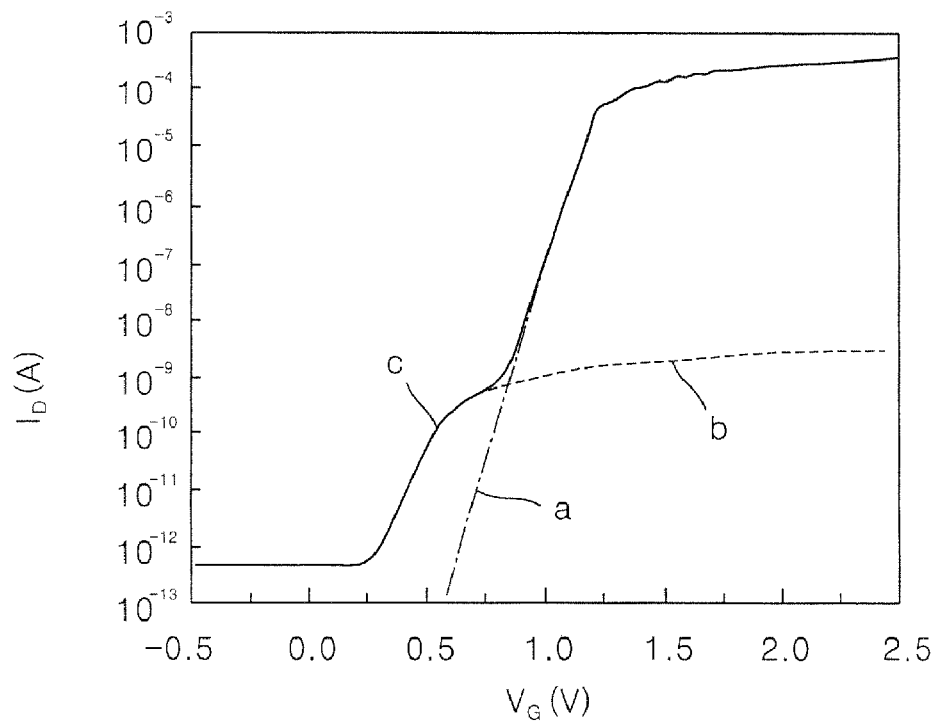
FIG. 12 is a graph illustrating drain current characteristics in accordance with a gate voltage of a transfer transistor of the SRAM of FIG. 2.

FIG. 12 illustrates the drain current characteristics of the transfer transistors PS1 and PS2 which have at least two different threshold voltage levels. As the gate voltage VG increases, the drain current ID of the transfer transistors PS1, PS2 varies along a third curve "c," which is a combination of a first curve "a" and a second curve "b." The drain current ID initially increases mostly along the second curve b around the first threshold voltage level, for example, 0.1 V. When VG is further increased and reaches the region of a second threshold voltage level, for example 0.6V, drain current ID increases rapidly along the first curve a. As the saturation current of curve a is much higher than the saturation current of curve b, the overall saturation current of curve c is determined mostly by the first curve a.

Thus, when different threshold voltages coexist along the width of the gate of a transistor, a curve c having a hump or kink results. That is, a portion of each of the transfer transistors PS1 and PS2 may have characteristic similar to the first curve a, and the other portion may have characteristic similar to the second curve b. The hump characteristic results in a leakage current when the gate voltage is between the two levels of the threshold voltages. The leakage current, as explained later, may be an off-current.

Figure 3:
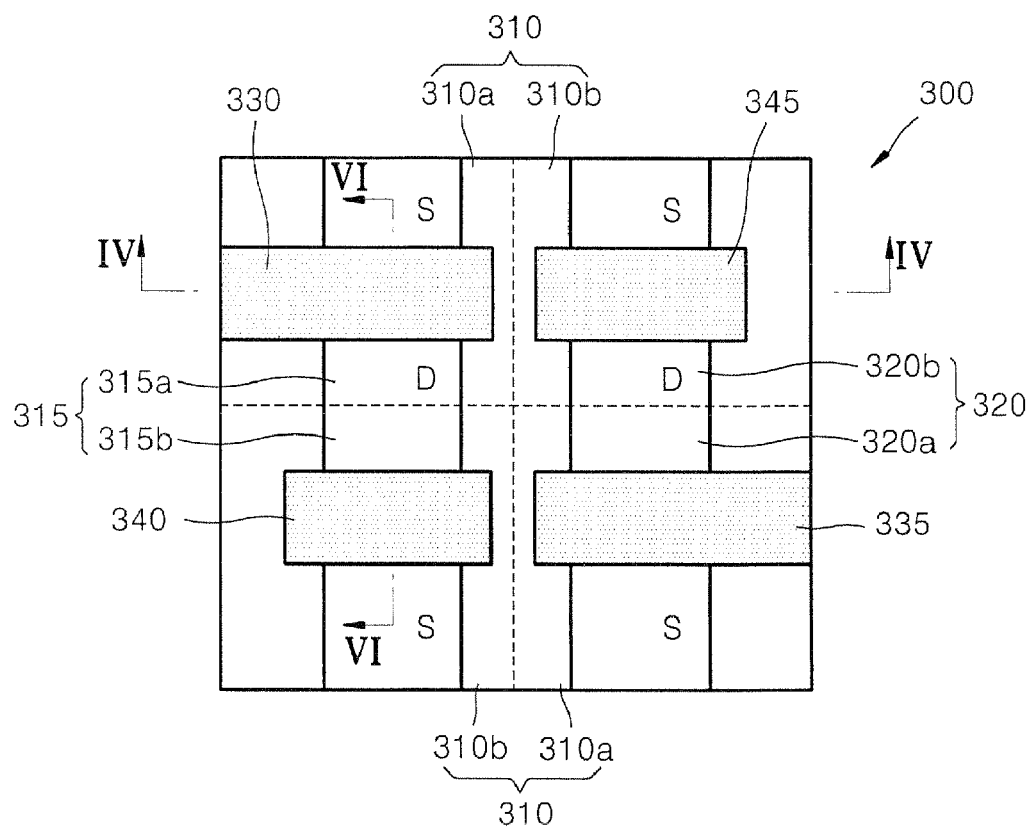
FIG. 3 is a plan view illustrating an embodiment of a structure of the SRAM of FIG. 2 according to some inventive principles of this patent disclosure.
Figure 4:
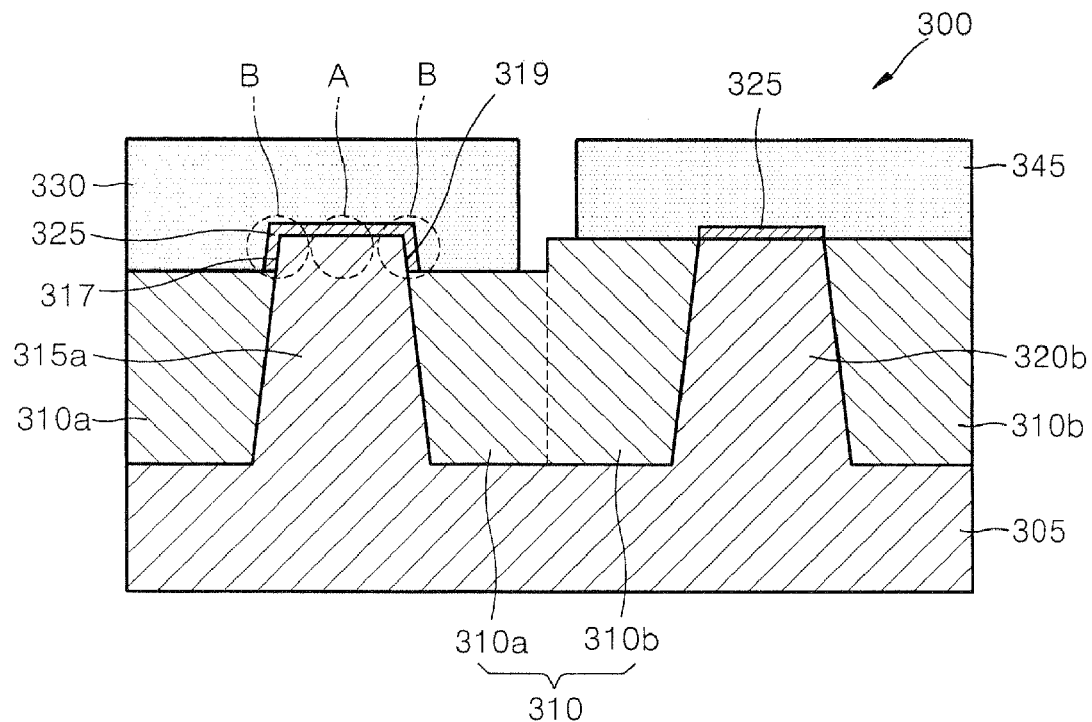
FIG. 4 is a cross-sectional view taken along a line IV-IV' of the structure of FIG. 3.
Figure 6:
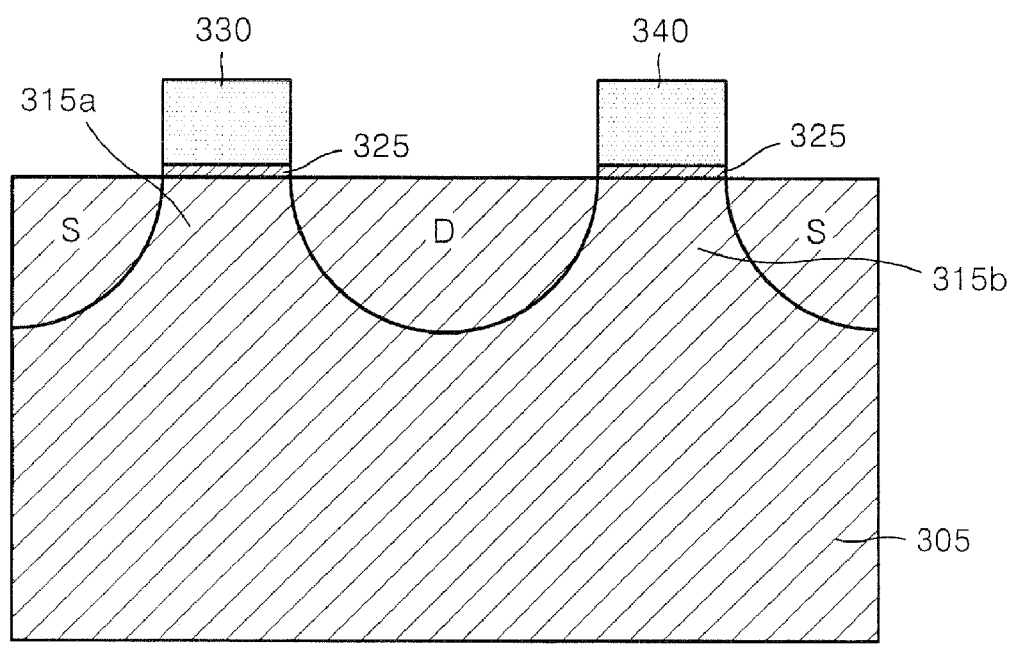
FIG. 6 is a cross-sectional view taken along a line VI-VI' of the structure of FIG. 3.

Hereinafter, the structure of the SRAM 200 will be explained in more detail. FIG. 3 is a plan view illustrating an exemplary structure 300 of the SRAM 200 according to some inventive principles of this patent disclosure. FIG. 4 is a cross-sectional view taken along the line IV-IV' of the structure 300, and FIG. 6 is a sectional view taken along the line VI-VI of the structure 300.

FIG. 3 includes a pair of active regions 315 and 320 confined by an isolation layer 310. The first active region 315 includes a first portion 315a and a second portion 315b, and the second active region 320 includes a third portion 320a and a fourth portion 320b. A first transfer gate electrode 330 may be disposed to cross the first portion 315a and extend to the isolation layer 310, and a second transfer gate electrode 335 may be disposed to cross the third portion 320a and extend to the isolation layer 310. A first drive gate electrode 340 may be disposed to cross the second portion 315b and extend to the isolation layer 310, and a second drive gate electrode 345 may be disposed to cross the fourth portion 320b and extend to the isolation layer 310.

Sources S and drains D may be formed in the first active region 315 at both sides of the first transfer gate electrode 330 and the first drive gate electrode 340. For example, sources S may be formed in the first portion 315a and in the second portion 315b, and drains D may be formed in the first portion 315a and the second portion 315b as shown. The drains D of 315a and 315b may be connected. Similarly, sources S and a drain D may be formed in the second active region 320 at both sides of the second transfer gate electrode 335 and the second drive gate electrode 345. However, the inventive principles of this patent disclosure are not restricted to this particular orientation of the sources and the drains; the source and drain locations can be reversed as well.

Referring to FIGS. 2 and 3, the first transfer gate electrode 330 and the source S and drain D at both sides of the first transfer gate electrode 330 may constitute a first transfer transistor PS1, and similarly, the second transfer gate electrode 335 and the source S and drain D at both sides of the second transfer gate electrode 335 may constitute a second transfer transistor PS2. The first drive gate electrode 340 and the source S and drain D at both sides of the first drive gate electrode 340 may constitute a first drive transistor PD1, and similarly, the second drive gate electrode 345 and the source S and drain D at both sides of the second drive gate electrode 345 may constitute a second drive transistor PD2. Gates 203, 213, 223 and 233 may use the transfer gate electrodes 330 and 335 and the drive gate electrodes 340 and 345 as respective terminals.

Referring to FIGS. 3 and 4, the isolation layer 310 includes a recessed portion 310a and a normal portion 310b. Side walls of the second and the fourth portions 315b and 320b are surrounded by the normal portion 310b. The upper ends of side walls 317 and 319 of the first portion 315a are exposed from the recessed portion 310a. Similarly, though not shown in the drawings, upper ends of side walls (not shown) of the third portion 320a are exposed from the recessed portion 310a. The first portion 315a includes a middle portion A and a pair of edge portions B through which the side walls 317 and 319 are exposed. The third portion 320a may also include a middle portion A and a pair of edge portions B.

The first transfer gate electrode 330 may surround the exposed upper ends of the side walls 317 and 319 of the first portion 315a, and may be insulated from the first portion 315a by a gate insulating layer 325. The second drive gate electrode 345 may be disposed to cross the fourth portion 320b, and may be insulated from the fourth portion 320b by the gate insulating layer 325. Similarly, the second transfer gate electrode 335 and the first drive gate electrode 340 may be insulated from the third portion 320a and the second portion 315b respectively by the gate insulating layer 325.

Figure 5:
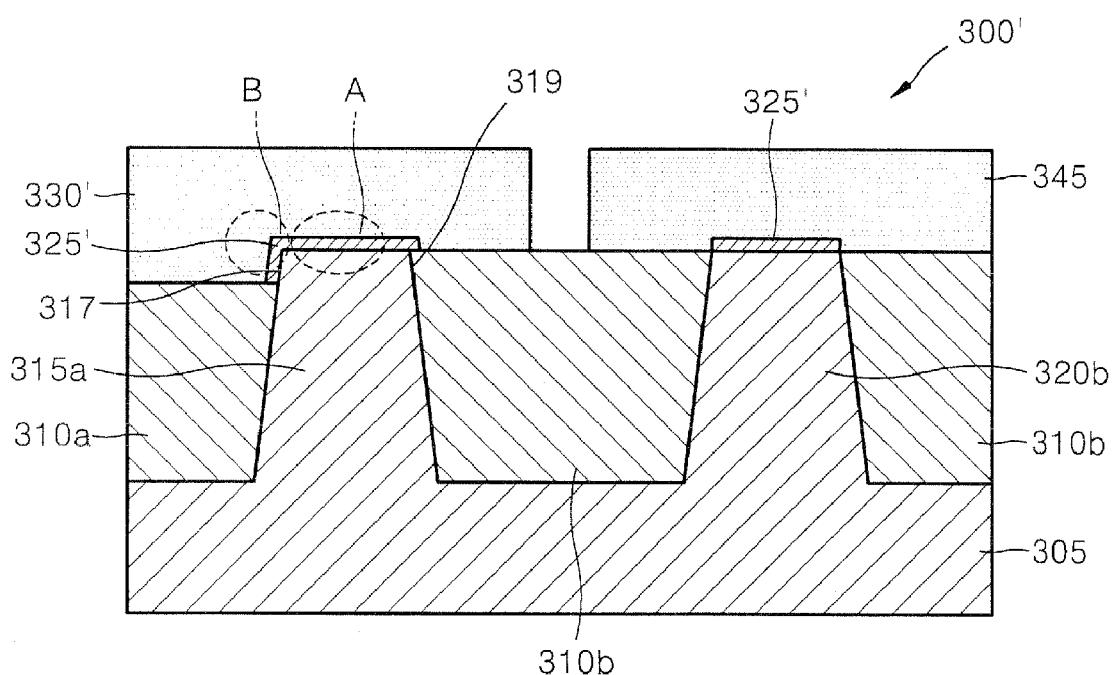
FIG. 5 is a cross-sectional view illustrating a modified example embodiment of the structure of FIG. 4 according to some inventive principles of this patent disclosure.

FIG. 5 is a cross-sectional view illustrating another embodiment of the structure of FIG. 4 according to some inventive principles of this patent disclosure. Referring to FIG. 5, an upper end of the side wall 317 of the first portion 315a is exposed from the isolation layer 310, and the side wall 319 is not exposed. However, in alternate embodiments, only an upper end of the side wall 319 may be exposed from the isolation layer 310, and the side wall 317 may not be exposed. That is, the first portion 315a may include an edge portion on which the side wall 319 is not exposed, a middle portion A, and an edge portion B having the side wall 317, which is exposed. Similarly, only one side wall of the third portion 320a may be exposed by the isolation layer 310.

Referring to FIGS. 3 and 6, the sources S and drains D may be formed with a predetermined depth from surfaces of the first and second portions 315a and 315b of the semiconductor substrate 305. The sources S and the drains D may make diode-junctions with the first and second portions 315a and 315b. For example, the sources S and the drains D may be doped with impurities.

Referring to FIGS. 3 through 6, the transfer gate electrodes 330 and 335 and the drive gate electrodes 340 and 345 may be formed of polysilicon, metal, metal silicide, or a combination layer in which two or more of the materials are stacked. The isolation layer 310 may be formed of an insulating layer, for example, a silicon oxide layer, a silicon nitride layer, or a combination thereof. The gate insulating layer 325 may be selected after considering dielectric constant and leakage current characteristics, and may be formed of, for example, a silicon oxide layer, a silicon nitride layer, a high-k dielectric layer, or a combination thereof.

Referring to FIGS. 4 and 12, the hump characteristic of the curve c of the first transfer transistor PS1 comprising the first transfer gate electrode 330 will be explained in detail. The middle portion A and the edge portions B of the first portion 315a may have different levels of threshold voltages. This is because an electric field in the middle portion A is formed almost perpendicular to the semiconductor substrate 305 by the voltage applied to the first transfer gate electrode 330, but an electric field in the edge portions B is formed parallel to the semiconductor substrate 305 as well as in a perpendicular direction thereto. That is, the electric field is concentrated in the edge portions B so as to increase the electric field density. Thus, the threshold voltage of the edge portions B may be lower than that of the middle portion A.

The drain current resulting from a channel formed in the middle portion A follows the first curve a of FIG. 12. On the other hand, the drain current resulting from a channel formed in the edge portions B follows the first curve b of FIG. 12. Since the middle portion A and the edge portions B are connected in parallel based on the source S and drain D, the drain current ID is varied along a third curve c which is a summation of the two curves a and b. Since the area of the middle portion A is much greater than the area of the edge portions B, the saturation current of the first curve a is much larger, for example, 105 times, than the saturation current of the second curve b. Similar hump characteristic may be applied to the second transfer transistor PS2 having the second transfer gate electrode 335.

Figure 7:
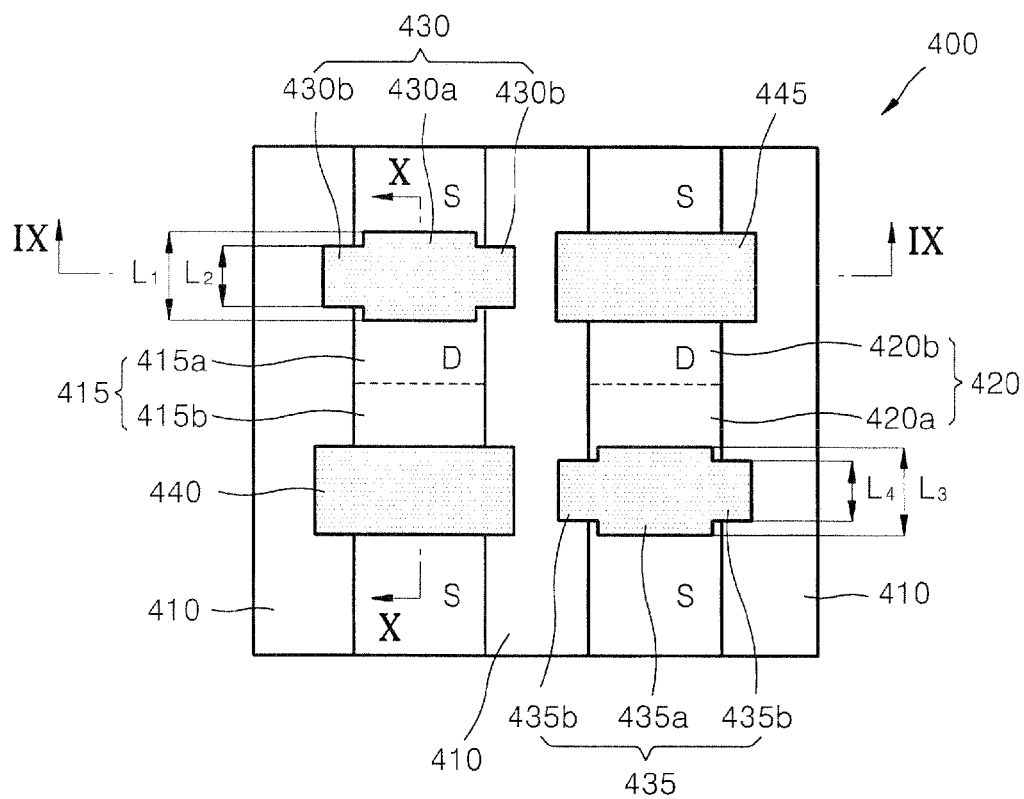
FIG. 7 is a plan view illustrating an embodiment of a structure of the SRAM of FIG. 2 according to some inventive principles of this patent disclosure.
Figure 9:
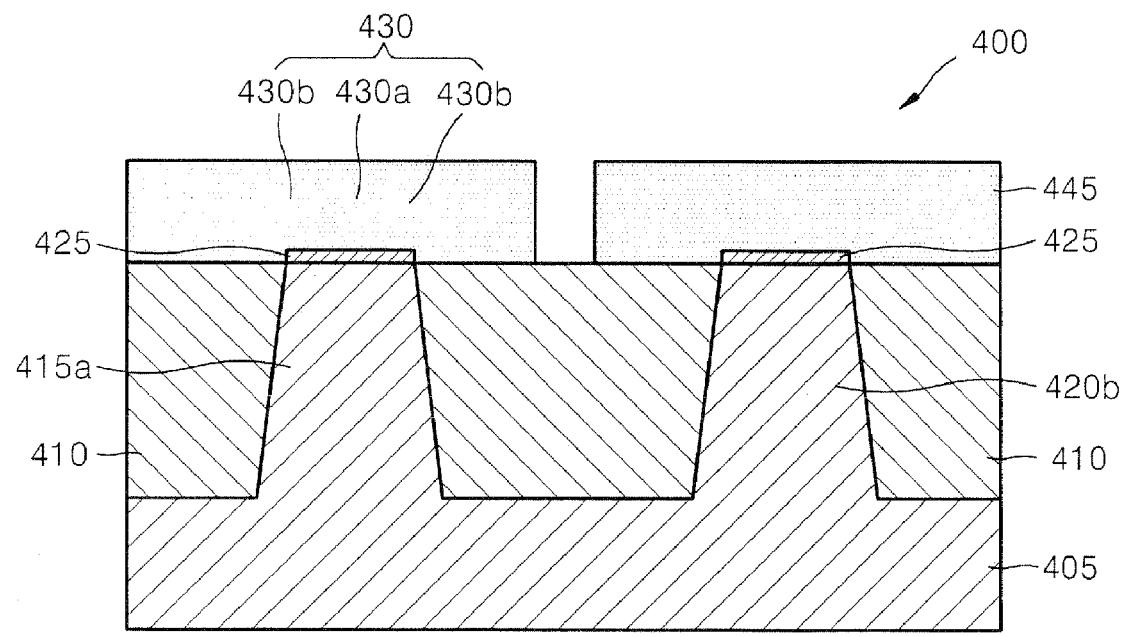
FIG. 9 is a cross-sectional view taken along a line IX-IX' of the structure of FIG. 7.
Figure 10:
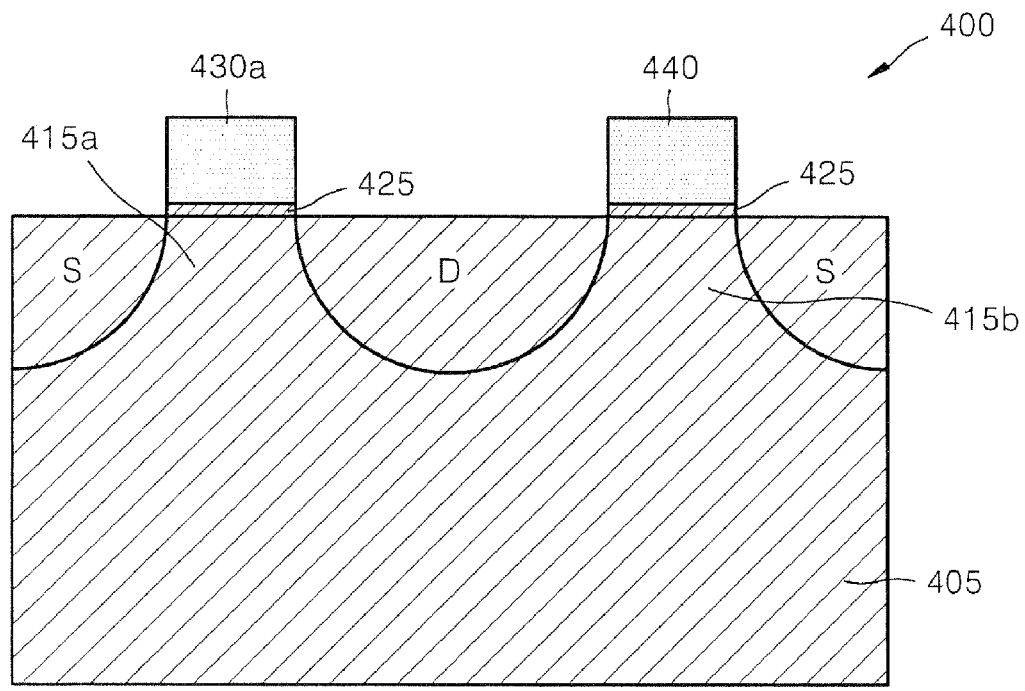
FIG. 10 is a cross-sectional view taken along a line X-X' of the structure of FIG. 7.

FIG. 7 is a plan view of a structure 400 illustrating another exemplary embodiment of the SRAM 200 in accordance with some inventive principles of this patent disclosure. FIG. 9 is a cross-sectional view of the structure 400 taken along a line IX-IX' of the structure 400, and FIG. 10 is a cross-sectional view taken along a line X-X' of the structure 400. The structure 400 may refer to the structure 300 illustrated in FIGS. 3 through 6.

Referring to FIGS. 7, 9 and 10, a pair of active regions 415, 420 are confined by an isolation layer 410. The first active region 415 may include a first portion 415a and a second portion 415b, and the second active region 420 may include a third portion 420a and a fourth portion 420b. A first transfer gate electrode 430 may be disposed to cross the first portion 415a and to extend to the isolation layer 410, and the second transfer gate electrode 435 may be disposed to cross the third portion 420a and to extend to the isolation layer 410. A first drive gate electrode 440 may be disposed to cross the second portion 415b and to extend to the isolation layer 410, and a second drive gate electrode 445 may be disposed to cross the fourth portion 420b and to extend to the isolation layer 410. Transfer gate electrodes 430, 435 and drive gate electrodes 440 and 445 may be insulated from the first and second active regions 415 and 420 by a gate insulating layer 425.

The first transfer gate electrode 430 may include a first middle portion 430a having a first gate length L1, on a middle portion of the first portion 415a, and first edge portions 430b having a second gate length L2 on both edge portions of the first portion 415a. Similarly, the second transfer gate electrode 435 may include a second middle portion 435a having a third gate length L3 on a middle portion of the third portion 420a, and second edge portions 435b having a fourth gate length L4 on both edge portions of the third portion 420a. In this example embodiment, the first gate length L1 is greater than the second gate length L2, and the third gate length L3 is greater than the fourth gate length L4.

Referring to FIGS. 2 and 7, the first transfer gate electrode 430, and a source S and drain D on both sides thereof constitute a first transfer transistor PS1, and similarly, the second transfer gate electrode 435 and a source S and drain D on both sides thereof constitute a second transfer transistor PS2.

The first drive gate electrode 440, and a source S and drain D on both sides thereof constitute a first drive transistor PD1, and similarly, the second drive gate electrode 445 and a source S and drain D on both sides thereof constitute a second drive transistor PD2. Gates 203, 213, 223 and 233 may use the transfer gate electrodes 430 and 435 and the drive gate electrodes 440 and 445 as respective terminals.

Figure 8:
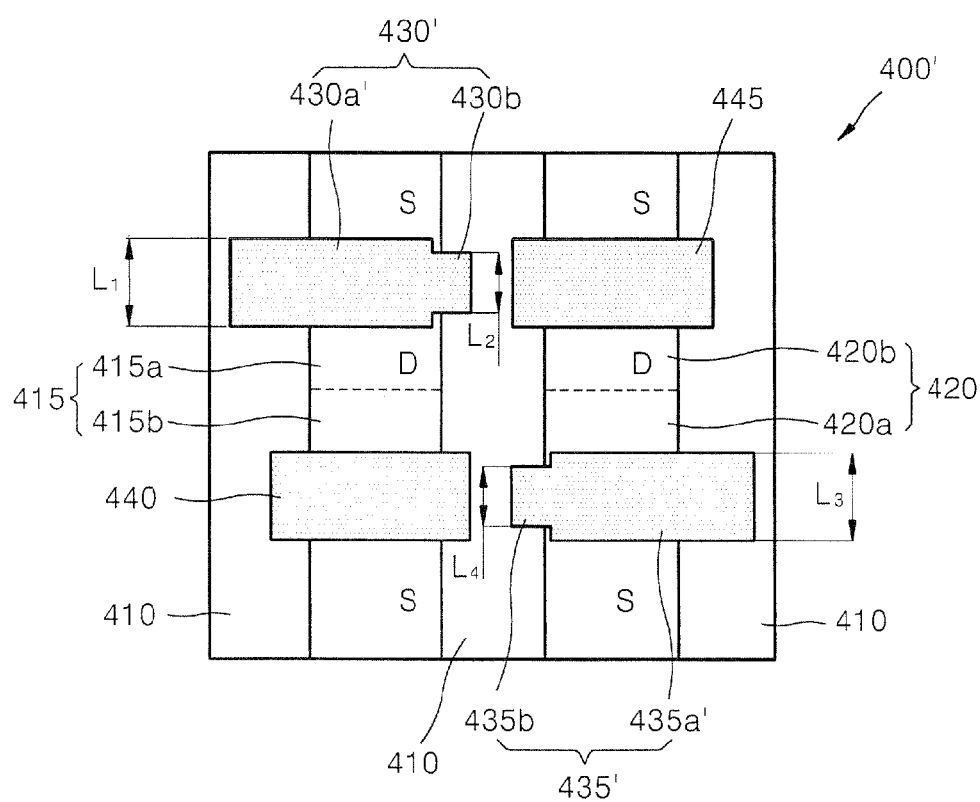
FIG. 8 is a plan view illustrating a modified embodiment of the structure of FIG. 7 according to some inventive principles of this patent disclosure.

FIG. 8 is a plan view illustrating a modified example embodiment of the structure of FIG. 7 according to some additional inventive principles of this patent disclosure. Referring to FIG. 8, a first transfer gate electrode 430' may include a first edge portion 430b having a second gate length L2 on a first edge portion of the first portion 415a and a first middle portion 430a' formed on a middle portion of the first portion 415a and a second side edge portion thereof, having a first gate length L1. Similarly, a second transfer gate electrode 435' may include a second edge portion 435b and a second middle portion 435a', having lengths L4 and L3 respectively.

Referring to FIG. 7 again, a portion of the first transfer transistor PS1 including the first edge portion 430b may have a lower threshold voltage than that of a portion of the first transfer transistor PS1 including the first middle portion 430a. This is because the threshold voltage is reduced by a short channel effect as a gate length is reduced in a sub-micron transistor.

Therefore, the first transfer transistor PS1 has at least two threshold voltages, and the relationship between the drain current ID and the gate voltage VG has a hump characteristic as illustrated in FIG. 12. Similarly, the second transfer transistor PS2 has at least two levels of threshold voltage and similar hump characteristics.

Operation

A method of operating the SRAM 200 will be explained with reference to FIG. 2. Here, the transfer transistors PS1 and PS2 and the drive transistors PD1 and PD2 are all NMOSFETs. However, the inventive principles of this patent disclosure can be applied to other situations as well, for example, when all these transistors are PMOSFETs.

Referring to FIG. 2, a first voltage is applied to the word line WL in a stand-by state, and a second voltage is applied to the bit lines BL1 and BL2. In this case, the two transfer transistors PS1 and PS2 are in an off-state, and thus, the off-currents of the transfer transistors PS1 and PS2 maintain the potential of nodes N1 and N2. For example, in order to maintain node N1 in a high, the first off-current introduced into the first node N1 through the first transfer transistor PS1 must be higher than the second off-current flowing into the third node N3 through the first drive transistor PD1.

The first voltage applied to the word line WL is between two threshold voltages of the first transfer transistor PS1, for example, a first threshold voltage and a second threshold voltage, and may be between two threshold voltages of the second transfer transistor PS2, for example, a third threshold voltage and a fourth threshold voltage. For example, the first voltage may be equal to the lower of the two threshold voltages of the first transfer transistor PS1, for example, the second threshold voltage. Alternatively, the first voltage may also be equal to the lower of the two threshold voltages of the second transfer transistor PS2, for example, the forth threshold voltage. As another example, the first voltage may be equal to the higher of the second threshold voltage and the fourth threshold voltage.

The transfer transistors PS1 and PS2 follow the characteristic of the third curve c in FIG. 12. Thus, the transfer transistors PS1 and PS2 having hump characteristics in a stand-by state are partially turned on, and as a result, may have a high leakage current as illustrated by the third curve c. This may happen when channels are formed in edge portions B but not in the middle portion A of FIG. 4. On the other hand, the drive transistors PD1 and PD2 follow the characteristic of the first curve a illustrated in FIGS. 11 and 12. The third curve c may have higher leakage currents in an off-state than those of the first curve a. Thus, states of the nodes N1 and N2 are stable, and the stand-by stability of the SRAM 200 can be increased.

During a read operation of the SRAM 200, a read voltage higher than two threshold voltages of the transfer transistors PS1 and PS2 is applied to the word line WL. Thus, the transfer transistors PS1 and PS2 are fully turned on, and the state of the nodes N1 and N2 can be read. In this case, channels may be formed in the middle portion A as well as the edge portions B of FIG. 4.

Fabrication

A method of fabricating an embodiment of a loadless SRAM according to some of the inventive principles of this patent disclosure will be explained with reference to FIGS. 13 through 19. An SRAM fabricated using this method may be the same as the structure 300 explained with reference to FIGS. 3 through 6, and thus, the description of FIGS. 3 through 6 may be referred to. Like reference numerals in the drawings denote like elements.

Figure 13:
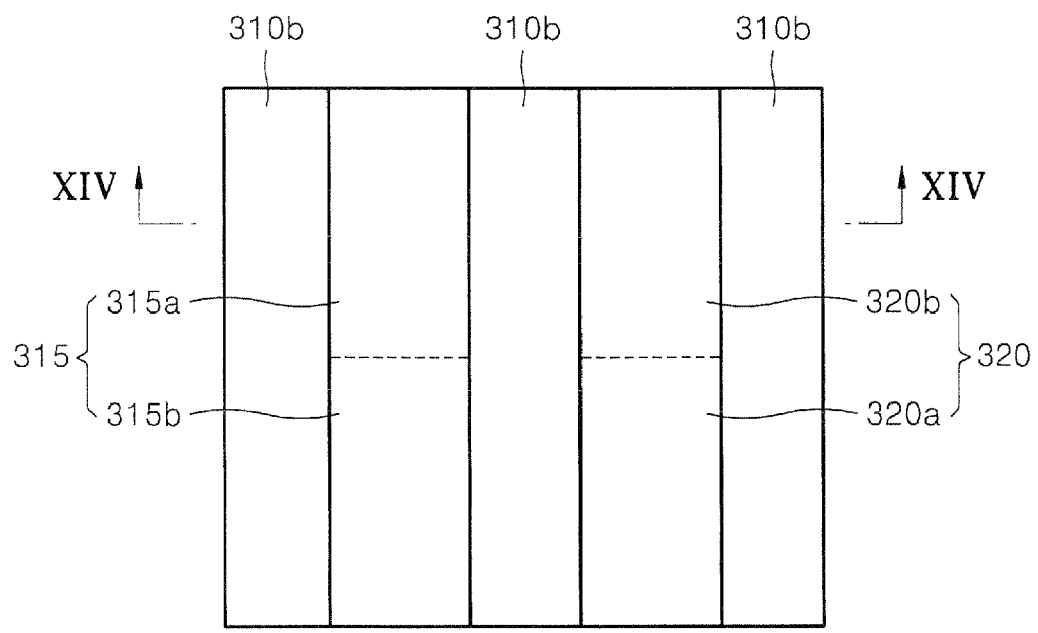
FIGS. 13 and 15 are plan views illustrating an embodiment method of fabricating a loadless SRAM according to some inventive principles of this patent disclosure.
Figure 14:
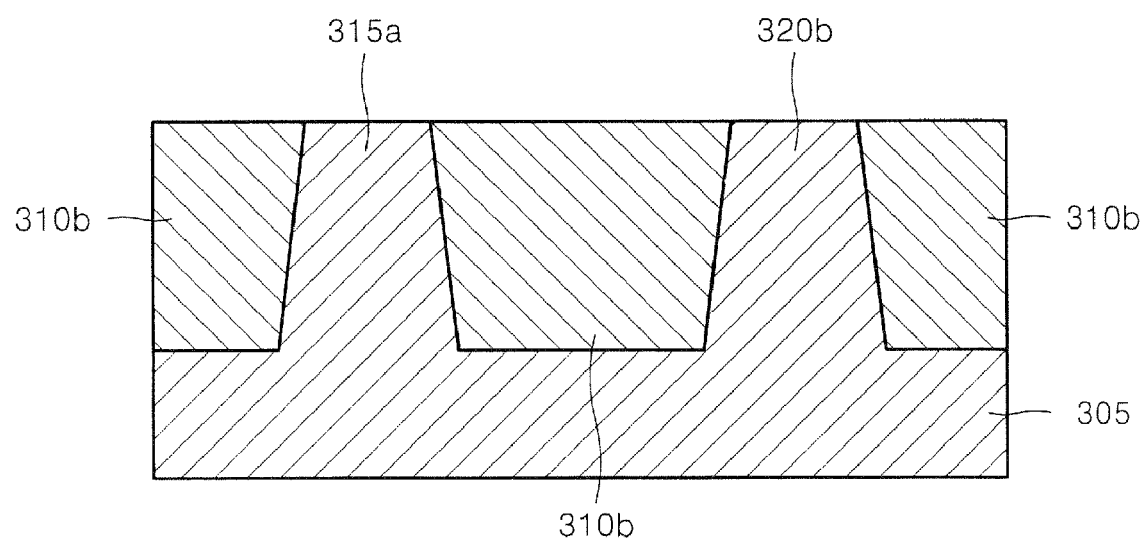
FIG. 14 and FIGS. 16 through 19 are cross-sectional views illustrating an exemplary embodiment of a method of fabricating a loadless SRAM according to some inventive principles of this patent disclosure.

Referring to FIGS. 13 and 14, an isolation layer 310b is formed in a semiconductor substrate 305 to confine first and second active regions 315 and 320. The substrate may be any suitable material, for example, a silicon wafer, or a silicon-germanium wafer. The first active region 315 may include a first portion 315a and a second portion 315b, and the second active region 320 may include a third portion 320a and a fourth portion 320b.

The isolation layer 310b may be formed, for example, using a typical shallow trench isolation (STI) formation method. More specifically, a trench (not shown) is formed in the semiconductor substrate 305, and an insulating layer is buried in the trench, thereby forming the isolation layer 310b. The isolation layer 310b may be an insulating layer, for example, an oxide layer, a nitride layer, or a combination thereof.

Figure 15:
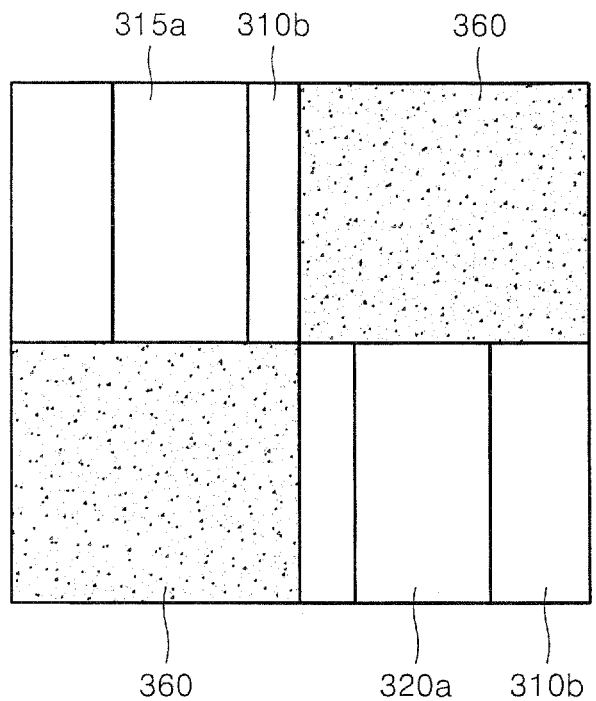
Figure 16:
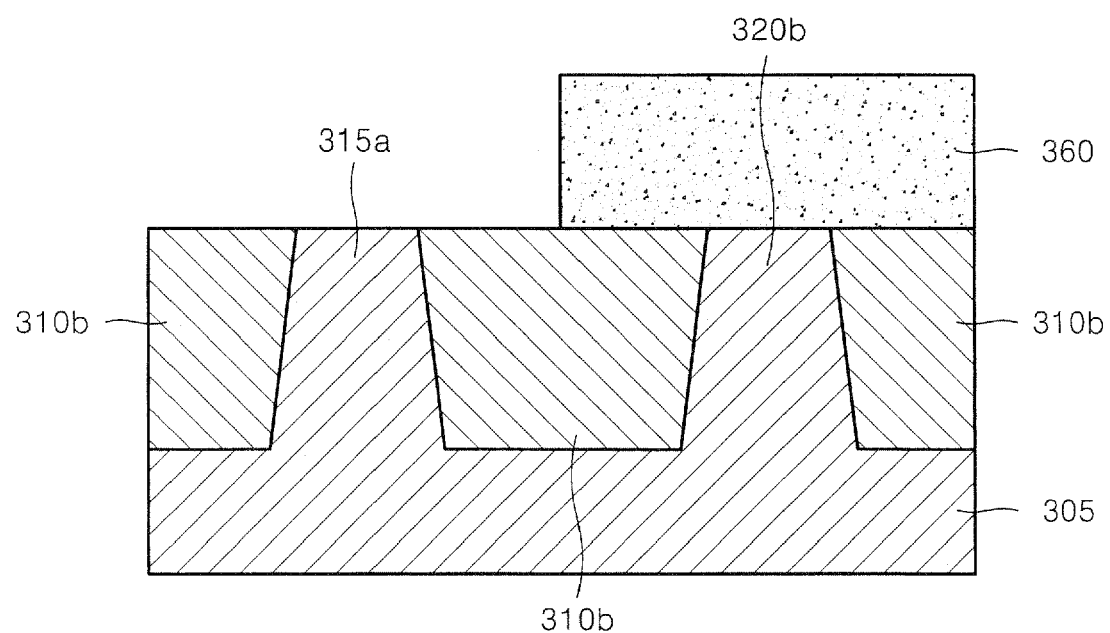

Referring to FIGS. 15 and 16, a photoresist pattern 360 is formed on the second portion 315b and the fourth portion 320b. The first portion 315a and the third portion 320a, and the isolation layer 310b surrounding the side walls thereof are exposed from the photoresist pattern 360. The photoresist pattern 360 may be formed using a typical photolithography method.

Figure 17:
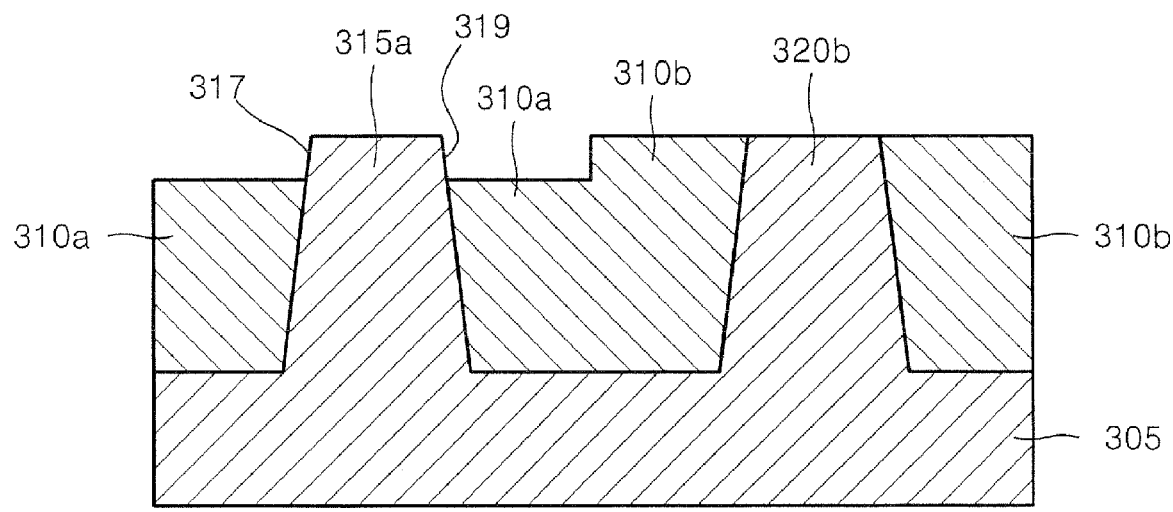

Referring to FIG. 17, the isolation layer 310b is selectively etched to a predetermined thickness using the photoresist pattern 360 (FIG. 16) as an etch protecting layer. Thus, upper ends of the side walls 317 and 319 of the first portion 315a are exposed from an etched isolation layer 310a. Even though the upper ends of both side walls 317 and 319 are exposed in FIG. 17, the upper end of only one of the side walls 317 and 319 may be exposed in another embodiment (refer to FIG. 5).

By controlling the etch time during the selective etch process, the height of the etched isolation layer 310a can be controlled, and thus, the height of the exposed upper ends of the side walls 317 and 319 can also be controlled. A function of the exposed portion of the upper ends of the side walls 317 and 319 is to control the value of off-current of the first transfer transistor PS1 (FIG. 2). Thus, the off-current may be controlled to achieve a desired value. Even though not shown in the drawings, upper ends of the side walls of the third portion 320a can also be concurrently exposed from the etched isolation layer 310a during the exposure process. The selective etch process may be accomplished through the use of a wet etch method or a dry etch method capable of selectively etching the isolation layer 310b rather than the active regions 315 and 320 (FIG. 13) including the first portion 315a. For example, when the isolation layer 310b is formed of an oxide layer, a wet etch method using HF or buffered oxide etchant (BOE) can be used to etch the isolation layer 310b.

Figure 18:
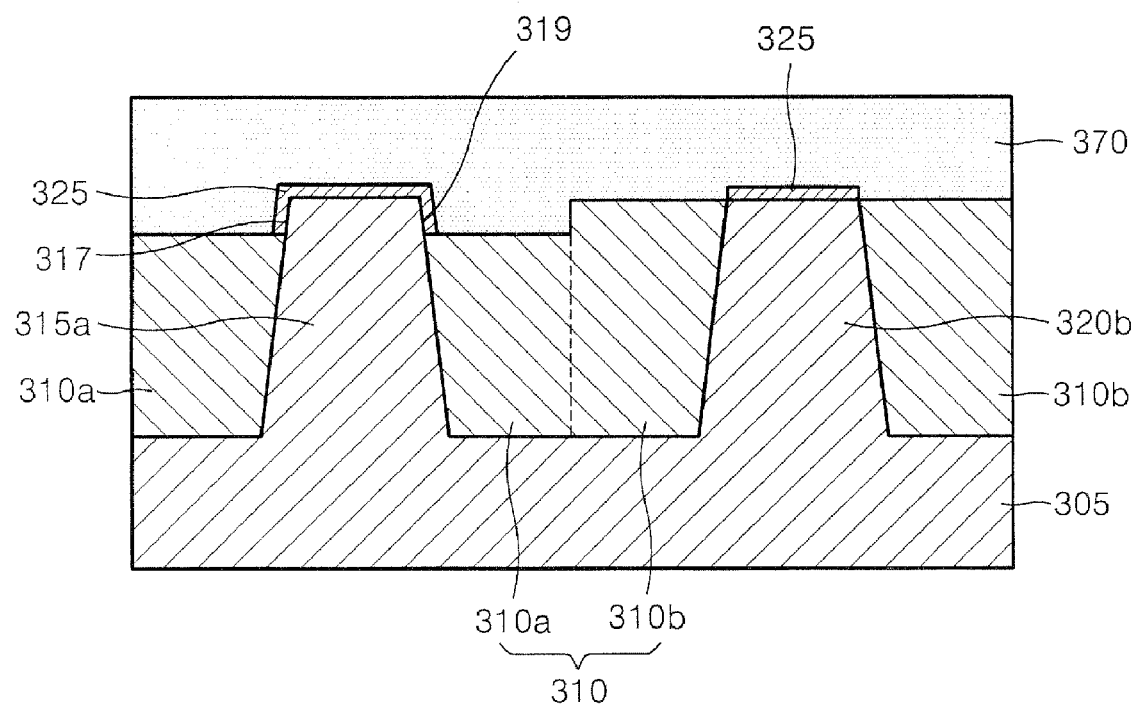

Referring to FIG. 18, a gate insulating layer 325 is formed on the active regions 315 and 320 (FIG. 13) including the first portion 315a having the exposed upper ends of the side walls 317 and 319, and the fourth portion 320b. For example, the gate insulating layer 325 may be formed by thermally oxidizing the active regions 315 and 320. Alternatively, the gate insulating layer 325 may be formed by depositing an insulating layer on the active regions 315 and 320 and the isolation layers 310a and 310b using a typical deposition method.

Next, a gate electrode layer 370 is formed on the gate insulating layer 325. The gate electrode layer 370 may be formed using a typical material layer deposition method. For example, the gate electrode layer 370 may be formed of polysilicon, metal, metal silicide, or a combination thereof.

Figure 19:
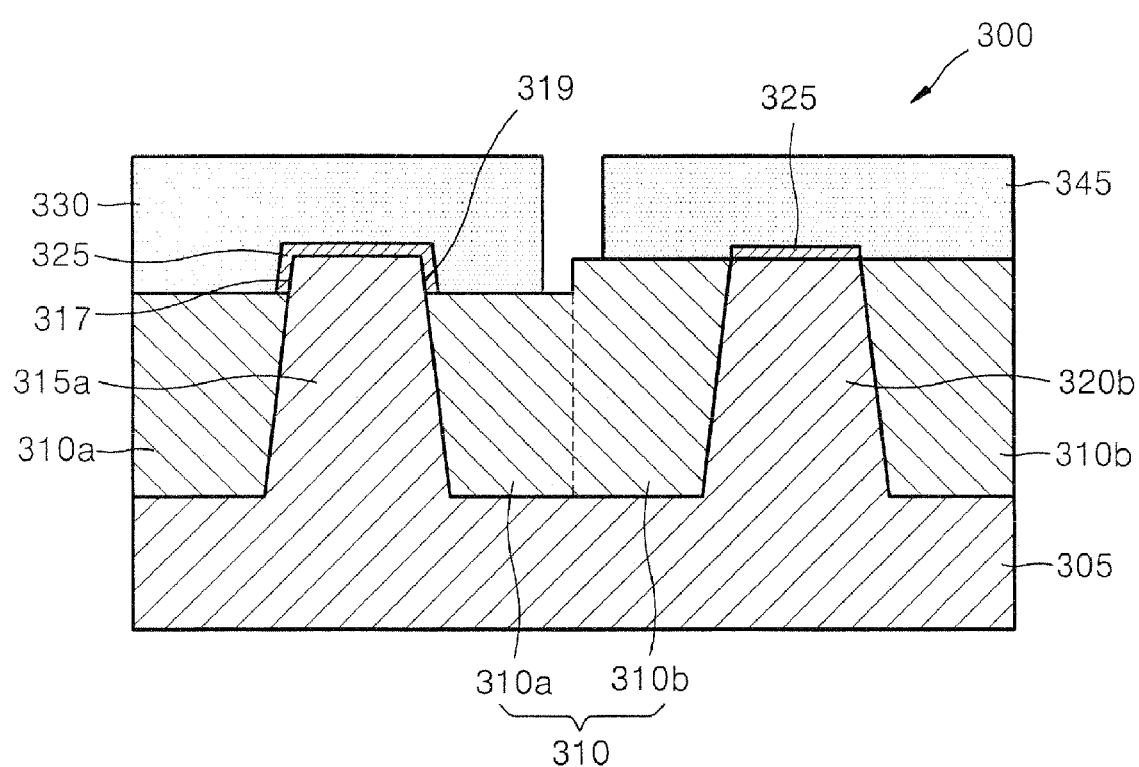

Referring to FIGS. 3 and 19, the gate electrode layer 370 is patterned, thereby forming transfer gate electrodes 330 and 335, and drive gate electrodes 340 and 345. The patterning operation may be performed using typical photolithography and etch processes. For example, a photoresist pattern (not shown) is formed, and the gate electrode layer 345 may be etched using the photoresist pattern as an etch protecting layer.

Referring to FIG. 3, sources S and drains D may be formed on both sides of the transfer gate electrodes 330 and 335 and the drive gate electrodes 340 and 345 respectively. The sources S and drains D may be formed using an impurity implantation process and an annealing process, which are widely known to those skilled in the art.

Multi-level metal interconnections may then be formed using a method which is widely known to those skilled in the art. For example, the drive gate electrodes 340 and 345 may be connected to nodes N1 and N2 (FIG. 2), as well as the flip-flop structure, through metal interconnections. Further, the word line WL (FIG. 2) and the bit lines BL1, BL2 (FIG. 2) may be formed using metal interconnections.

With this embodiment, only four transistors PS1, PS2, PD1 and PD2 (FIG. 2) are used unlike a conventional six-transistor structure, and hence, the number of metal interconnection layers may be reduced. The reduction of the number of metal interconnection layers may decrease fabrication costs and fabrication time of the SRAM 200 dramatically. As a result, the production yield may improve.

The SRAM 400 described in FIGS. 7 through 10 may be fabricated in a manner similar to that described above, but the operation of etching the isolation layer 310b (FIG. 16) using the fabrication method described above may be omitted, and a method of forming the transfer gate electrodes 430, 435 (FIG. 7) into a double gate-length structure may be added.

For example, as illustrated in FIG. 18, a gate electrode layer 370 is formed, and impurity ions are implanted into the region where first and second edge portions 430b (FIG. 7) of the gate electrode layer 370 will be formed. Then, the gate electrode layer 370 having implanted impurity ions may be patterned as illustrated in FIG. 19. The region where impurity ions are implanted may etch more quickly than the region where impurity ions are not implanted. Furthermore, the oxidation speed may be higher in the region where impurity ions are implanted. Thus, if a patterned resultant structure is recrystallized by oxidation, the gate length of the region where impurity ions are implanted is reduced, and thus, the SRAM 400 having the double gate-length structure illustrated in FIG. 7 may be formed.

As another example, as illustrated in FIG. 18, after a gate electrode layer 370 is formed, a patterning process as illustrated in FIG. 19 may be performed using a pattern mask as illustrated in FIG. 7, thereby forming the SRAM 400 as illustrated in FIG. 7.

While the present invention has been shown and described with reference to exemplary embodiments thereof, various changes in form and details may be made therein without departing from the scope of the inventive principles as defined by the following claims.

The invention claimed is:

1. A loadless static random access memory (SRAM) comprising: first and second drive transistors arranged to form a latch; and first and second transfer transistors arranged to couple first and second bit lines to the latch in response to a word line; wherein each of the transfer transistors has at least two threshold voltages of the same polarity.

2. The loadless SRAM of claim 1 where:
the first transfer transistor comprises a gate connected to the word line, a source connected to the first bit line, and a drain connected to a first node;
the second transfer transistor comprises a gate connected to the word line, a source connected to the second bit line, and a drain connected to a second node;
the first drive transistor comprises a gate connected to the second node, a source connected to a third node, and a drain connected to the first node; and
the second drive transistor comprises a gate connected to the first node, a source connected to the third node, and a drain connected to the second node.

3. The loadless SRAM of claim 1 wherein the first and second drive transistors and the first and second transfer transistors are all the same type.

4. The loadless SRAM of claim 3 wherein the type is an NMOSFET or a PMOSFET.

5. A loadless static random access memory (SRAM) comprising:
first and second drive transistors arranged to form a latch; and
first and second transfer transistors arranged to couple first and second bit lines to the latch in response to a word line;
wherein the transfer transistors have at least two threshold voltages;
wherein the first transfer transistor comprises a gate connected to the word line, a source connected to the first bit line, and a drain connected to a first node;
wherein the second transfer transistor comprises a gate connected to the word line, a source connected to the second bit line, and a drain connected to a second node;
wherein the first drive transistor comprises a gate connected to the second node, a source connected to a third node, and a drain connected to the first node;
wherein the second drive transistor comprises a gate connected to the first node, a source connected to the third node, and a drain connected to the second node; and
wherein an absolute value of a lower threshold voltage of the first transfer transistor is less than an absolute value of a threshold voltage of the second drive transistor, and an absolute value of a lower threshold voltage of the second transfer transistor is less than an absolute value of a threshold voltage of the first drive transistor.

6. The loadless SRAM of claim 5 wherein an absolute value of a higher threshold voltage of the first transfer transistor is equal to an absolute value of the threshold voltage of the second drive transistor, and an absolute value of a higher threshold voltage of the second transfer transistor is equal to an absolute value of the threshold voltage of the first drive transistor.

7. A loadless static random access memory (SRAM) comprising:
first and second drive transistors arranged to form a latch; and
first and second transfer transistors arranged to couple first and second bit lines to the latch in response to a word line;
wherein the transfer transistors have at least two threshold voltages; and
wherein:
a stand-by voltage applied to the word line is between two threshold voltages of the first transfer transistor, and between two threshold voltages of the second transfer transistor; and
a read voltage applied to the word line is higher than the two threshold voltages of the first transfer transistor, and higher than the two threshold voltages of the second transfer transistor.

8. The loadless SRAM of claim 7 wherein the stand-by voltage of the word line is equal to the lower of the two threshold voltages of the first transfer transistor, or equal to the lower of the two threshold voltages of the second transfer transistor.

9. The loadless SRAM of claim 7 wherein the stand-by voltage of the word line is equal to the higher of the two threshold voltages of the first transfer transistor and the lower of the two threshold voltages of the second transfer transistor.

10. A loadless SRAM comprising: a latch structure to store data; and a transfer structure to couple bit line data to the latch responsive to a word line; wherein the transfer structure comprises means for imparting multiple threshold levels to the transfer structure; wherein the means comprises at least one transfer transistor having a first and a second threshold; and
  wherein the first and second threshold voltages have the same polarity.

11. The loadless SRAM of claim 10 wherein the means comprises at least one transfer transistor having first and second threshold voltages.

12. The loadless SRAM of claim 11 wherein the transfer transistor comprises a gate structure having a first portion with a first threshold voltage and a second portion with a second threshold voltage.

13. A loadless SRAM comprising:

a latch structure to store data; and a transfer structure to couple bit line data to the latch responsive to a word line;

wherein the transfer structure comprises means for imparting multiple threshold levels to the transfer structure;

wherein the means comprises at least one transfer transistor having first and second threshold voltages;

wherein the transfer transistor comprises a gate structure having a first portion with a first threshold voltage and a second portion with a second threshold voltage; and wherein the first portion is structured to form an electric field mostly in a first direction and the second portion is structured to form an electric field at least partly substantially perpendicular to the first direction.

14. The loadless SRAM of claim 12 wherein the first portion has a first gate length and the second portion has a second gate length.

* * * * *